United States Patent
Park

(10) Patent No.: US 7,525,069 B2
(45) Date of Patent: Apr. 28, 2009

(54) BAKING UNIT HAVING DEVICE FOR SENSING THE ATTITUDE OF PARTS OF THE UNIT AND METHOD OF USE OF THE BAKING UNIT

(75) Inventor: Sung-Hwa Park, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 127 days.

(21) Appl. No.: 11/598,776

(22) Filed: Nov. 14, 2006

(65) Prior Publication Data

US 2007/0284362 A1    Dec. 13, 2007

(30) Foreign Application Priority Data

Jun. 9, 2006    (KR) ............... 10-2006-0051733

(51) Int. Cl.
*H05B 3/68* (2006.01)
(52) U.S. Cl. ............... 219/446.1; 219/444.1
(58) Field of Classification Search . 219/444.1–448.11, 219/390; 118/724–730; 432/258–259; 414/935–941
See application file for complete search history.

(56) References Cited

U.S. PATENT DOCUMENTS

| | | | | |
|---|---|---|---|---|
| 4,958,061 | A | * 9/1990 | Wakabayashi et al. | 219/411 |
| 5,054,991 | A | * 10/1991 | Kato | 414/783 |
| 5,980,194 | A | * 11/1999 | Freerks et al. | 414/754 |
| 6,107,609 | A | 8/2000 | Strodtbeck et al. | |
| 6,454,472 | B1 | * 9/2002 | Kim et al. | 396/611 |
| 6,654,668 | B1 | 11/2003 | Harada et al. | |
| 2006/0183340 | A1 | * 8/2006 | Hayashida et al. | 438/758 |

* cited by examiner

*Primary Examiner*—Sang Y Paik
(74) *Attorney, Agent, or Firm*—Volentine & Whitt, PLLC

(57) ABSTRACT

A baking unit, for use in photolithography equipment, has a sensing device for sensing whether components of the baking unit are level and whether particles are present on inner surfaces of the baking. The sensing device has a sensor unit and an optical element. The sensor unit is preferably mounted to the hot plate of the baking unit and includes a light emitter and a light detector. The optical element is preferably mounted to a cover of the baking unit at a position at which the optical element reflects/refracts light emitted from the light emitter to the light detector when the hot plate and the cover are level, and as long as particles are not present on the optical element.

19 Claims, 12 Drawing Sheets

BAKING UNIT HAVING DEVICE FOR SENSING THE ATTITUDE OF PARTS OF THE UNIT AND METHOD OF USE OF THE BAKING UNIT

BACKGROUND OF THE INVENTION

1. Field of the Invention

The present invention relates to photolithography used in the manufacturing of semiconductor devices and the like. More particularly, the present invention relates to a baking unit for baking a layer of photoresist during a photolithography process.

2. Description of the Related Art

In the manufacture of semiconductor devices, photolithography is used to transfer the image of a pattern, such as a circuit pattern, to a wafer. Photolithography typically entails a coating process of coating the wafer with photoresist, an exposure process of aligning the wafer with a mask bearing the pattern, and directing light such as ultraviolet light through the mask and onto the layer of photoresist, and a developing process of developing the exposed layer of photoresist to remove select (exposed or non-exposed) portions of the photoresist and thereby pattern the layer of photoresist. The photolithography process may further include a baking process of baking the photoresist before and after the exposure process to harden the photoresist, an HMDS (hexamethyl disilazane) treatment process of treating the wafer with HMDS to increase the adhesiveness between the photoresist and the wafer, and a cooling process of cooling the wafer.

A typical photolithography apparatus, therefore, includes units to coat the wafer with photoresist, expose the photoresist, bake the photoresist and develop the exposed photoresist, respectively. Highly-advanced semiconductor devices can only be manufactured using highly advanced photolithography apparatus which comprise large numbers of such individual processing units. In this respect, a recently developed photolithography apparatus has an inline system of a large number of coating, exposure and developing units which enables the multi-processing of wafers. Such an inline system is disclosed in U.S. Pat. No. 6,654,668.

Wafers are transferred between the units in the inline system by a transfer robot. Although the transfer robot may operate at a high speed with the aim of maximizing the yield of the photolithography process, the rapid operating speed of the transfer robot creates vibrations throughout the inline system. The magnitude of these vibrations is so great that respective elements which connect the units or which constitute the units may be loosened.

In particular, elements of the baking unit can come loose due to the vibrations generated by the transfer robot. The baking unit includes a chamber having a cover, and a hot plate disposed under the cover to heat a layer of photoresist on a wafer. More specifically, a wafer coated with photoresist is transferred into the baking unit by the transfer robot. Then, lift pins are raised through the hot plate to support the wafer held by the transfer robot whereupon the transfer robot is withdrawn from the chamber. Subsequently, the lift pins are lowered to lower the wafer onto the hot plate, and the baking process is carried out. However, the hot plate may be unbalanced in the case in which fasteners of the baking unit are loosened by vibrations generated by the transfer robot. That is, the upper surface of the hot plate may become skewed relative to the horizontal. As a result, the wafer may slide out of position on the hot plate as it is loaded onto the hot plate by the lift pins. Therefore, the wafer cannot provide heated uniformly and as such, the thickness of the layer of photoresist becomes non-uniform. Thus, some portions of the photoresist layer may not be developed properly during the developing process. If this occurs, the pattern of the developed photoresist layer may not have the desired CD (Critical Dimension). Furthermore, the wafer may even slide off of the hot plate as it is loaded onto the hot plate by the lift pins. In this case, the wafer may break on the bottom of the chamber. Thus, not only is the wafer destroyed but the baking unit is contaminated by particles of the broken wafer, thereby creating downtime in the photolithography equipment while the baking unit is cleaned.

Also, the cover of the baking unit may be dislocated by vibrations generated by the transfer robot. If the cover of the baking unit is not horizontal, heat can leak out from the chamber past the cover. As a result, temperature variations occur throughout the space in which the wafer is heated and thus, across the wafer. Therefore, the same problems as described above occur, i.e., the photoresist is not developed completely or the CD of the pattern does not correspond to the desired CD.

At present, the level of the hot plate or cover of the baking unit is checked by the naked eye. However, slight changes in the attitude of the hot plate or cover might not be discerned by the naked eye. Furthermore, even if changes in the attitude of the hot plate or cover are discerned, different technicians will level the hot plate or cover differently according to their own skill levels. Therefore, it is difficult to maintain uniformity in a baking process carried out in an inline system of photolithography equipment.

SUMMARY OF THE INVENTION

An object of the present invention is to provide a baking unit and a method of operation thereof which can prevent a substrate set on a hot plate of the unit from sliding along and/or off of the upper surface of the hot plate. Another object of the present invention is to provide a baking unit and a method of operation thereof which can ensure that a photoresist layer on a substrate is uniformly heated when the substrate is baked in the unit.

According to one aspect of the invention, there is provided a baking unit having a sensing device for sensing whether at least one key component of the unit has become dislocated.

The sensing device includes an optical sensor unit and an optical (reflecting/refracting) element. The sensor unit is mounted to either the hot plate or a cover of the baking unit. The optical element is mounted to the other of the hot plate and the cover. The sensor unit comprises a photo emitter that emits light and a photo detector that detects light of the type emitted by the photo emitter. The optical element is positioned relative to the sensor unit such that the optical element receives light emitted from the photo emitter and transmits a predetermined quantity of the received light to the photo detector when the baking unit is in a normal state. In the normal state both the hot plate and the cover are level, and inner surfaces of the baking unit are not covered with an excessive amount of particles.

According to another aspect of the invention, the baking unit is part of an inline system of photolithography equipment. In this case, the photolithography comprises a pre-exposure apparatus in which pre-exposure processes take place, an exposure apparatus in which an exposure process takes place, and an interface block connecting the pre-exposure apparatus and the exposure apparatus. The pre-exposure apparatus includes a plurality of units and a transfer device that transfers substrates between respective ones of the units. At least one of the units of the pre-exposure apparatus is the baking unit. The baking unit may be a soft bake baking unit, a post exposure bake baking unit and/or a hard bake baking unit. The soft bake baking unit is disposed downstream of the coating unit and upstream of the exposure apparatus with respect to the direction in which substrates are transferred through the photolithography equipment. The post exposure bake baking unit is disposed downstream of the exposure apparatus and upstream of the developing unit with respect to the direction in which substrates are transferred through the photolithography equipment. The hard bake baking unit is disposed downstream of the developing unit with respect to the direction in which substrates are transferred through the photolithography equipment.

According to another aspect of the invention, there is provided a method of operation of a baking unit in which an abnormal state of the unit can be detected before the unit is loaded with a wafer or other type of substrate. Light is emitted from a first location on the hot plate (or the cover) of the baking unit towards the cover (or the hot plate). The amount of the light transmitted from the cover (or the hot plate) to a second location on the hot plate (or the cover) is detected, and a determination is made as to whether the amount of light detected corresponds to a predetermined quantity of light that is transmitted from the cover (or the hot plate) to the second location when the baking unit is in a normal state. The baking unit is checked if the amount of light detected does not correspond to the predetermined quantity of light transmitted to the second location when the baking unit is in its normal state. Also, the baking unit is serviced when the amount of light detected does not correspond to the predetermined quantity of light. The wafer or other type of substrate is set on the hot plate only once the amount of light detected corresponds to the predetermined quantity of light. The wafer or other type of substrate is baked after it has been placed on the hot plate.

Checking the baking unit entails determining whether the hot plate has been dislocated and/or determining whether the cover has been dislocated. The servicing of the baking unit includes leveling the hot plate if the hot plate has been dislocated, and leveling the cover if the cover has been dislocated. The servicing of the hot plate may also include cleaning the baking unit to remove particles adhering to inner surfaces of the baking unit if neither the hot plate nor the cover has been dislocated

BRIEF DESCRIPTION OF THE DRAWINGS

These and other objects, features and advantages of the present invention will become more fully understood from the following detailed description of the preferred embodiments thereof made with reference to the accompanying drawings, wherein.

DETAILED DESCRIPTION OF THE PREFERRED EMBODIMENTS

Figure 1:
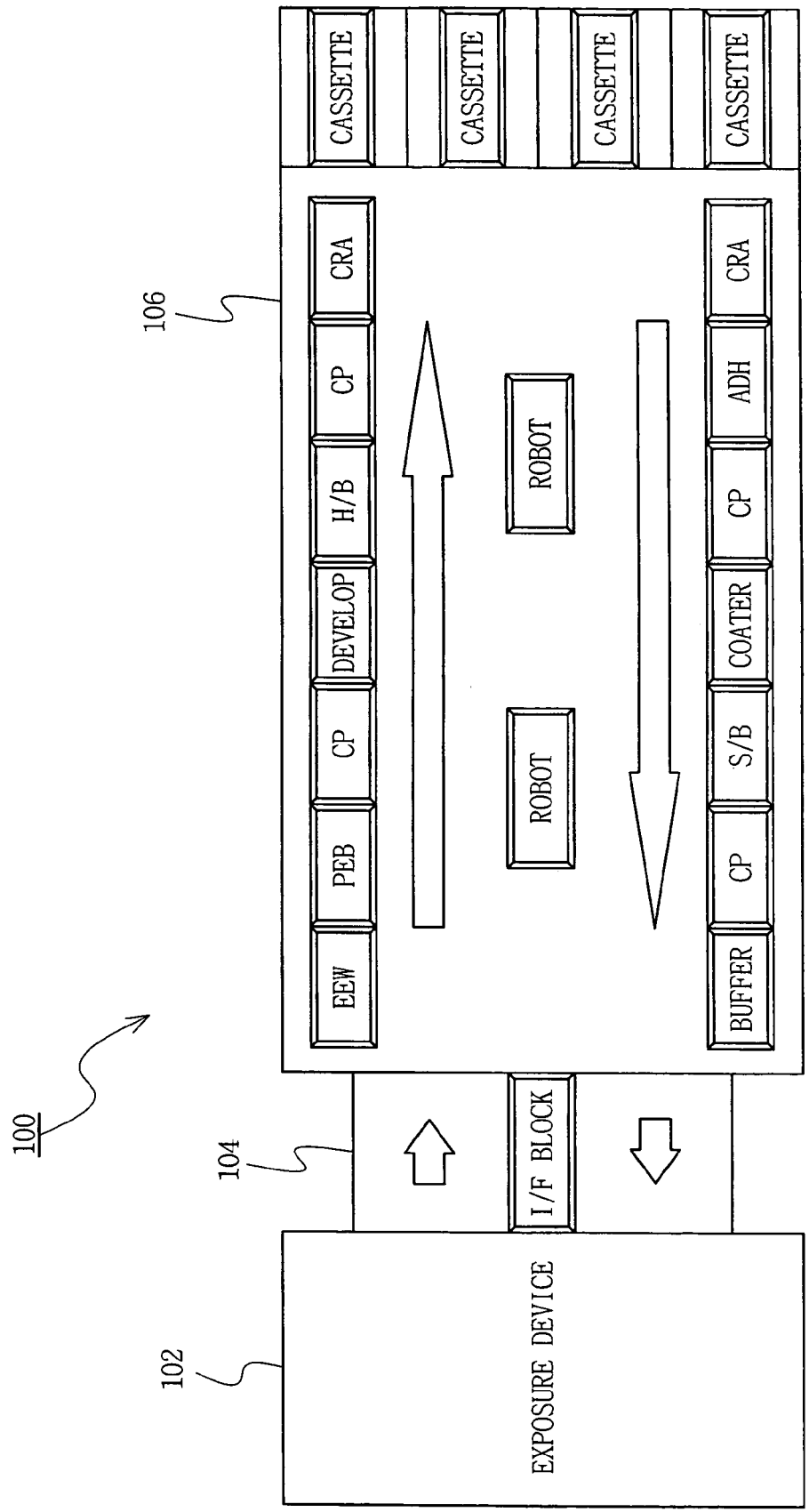
FIG. 1 is a schematic diagram of photolithography equipment having an inline system in which a baking unit according to the present invention is incorporated.

Referring to FIG. 1, photolithography equipment 100 having an inline system to which the present invention can be applied includes a spinning (pre-exposure) apparatus 106 in which a coating process and a developing process take place, an exposure apparatus 102 in which an exposure process takes place, and an interface block 104 connecting the spinning apparatus 106 and the exposure apparatus 102. The spinning apparatus 106 has a number of units including, for example, a cassette station at which cassettes (CASETTES) for storing lots of wafers (25 wafers per lot, for example) are supported, a coating unit (COATER) such as a spin-coating apparatus for coating a wafer with photoresist, a soft bake (S/B) baking unit for baking the layer of photoresist just after the wafer has been coated, a post exposure bake (PEB) baking unit for baking the layer of photoresist at a high temperature of about 110° C. after the wafer has been exposed in the exposure apparatus 102, a developing unit (DEVELOP) for developing the exposed photoresist, a hard bake (HB) baking unit for baking the photoresist at a high temperature of about 110° C. after the wafer has been developed in the developing unit, cooling plates (CP) for cooling the wafer to room temperature of about 23° C., and a transfer robot (ROBOT) for transferring the wafer between the units.

The photolithography equipment 100 basically operates as follows. First, an engineer loads a wafer cassette (CASETTE) in the spinning apparatus 106, a wafer is withdrawn from the cassette by the transfer robot (ROBOT) and is delivered by the robot to the coating unit (COATER), and an upper surface of the wafer is coated with photoresist by the coating unit (COATER). Next, the coated wafer is delivered by the transfer robot (ROBOT) through the interface block 104 and to the exposure apparatus 102. The layer of photoresist on the wafer is exposed in the exposure apparatus 102. Then the exposed wafer is picked up again by the transfer robot (ROBOT) and is delivered by the transfer robot (ROBOT) through the interface block 104 to the developing unit (DEVELOP) of the spinning apparatus 106. The wafer is developed in the developing unit (DEVELOP) to remove select (exposed or non-exposed) portions of the layer of photoresist. That is, a wafer loaded in the photolithography equipment 100 undergoes a series of processes such as coating the wafer with photoresist, exposing the resulting layer of photoresist and developing the photoresist. Also, the photoresist layer is baked after each of the coating, exposure and developing processes in the soft bake (S/B), post exposure bake (PEB) and hard bake (H/B) baking units, respectively. After that, the wafer is unloaded from the photolithography equipment 100.

The photoresist is a liquid comprising photosensitive material and a solvent such as acetone for dissolving the photosensitive material. The solvent is extremely volatile. The coating apparatus (COATER) rotates the wafer to create centrifugal force which spreads the photoresist across the upper surface of the wafer. About 80-90% of the solvent contained in the photoresist evaporates as the wafer is rotated and covered with the photoresist in the coating apparatus (COATER).

Figure 2:
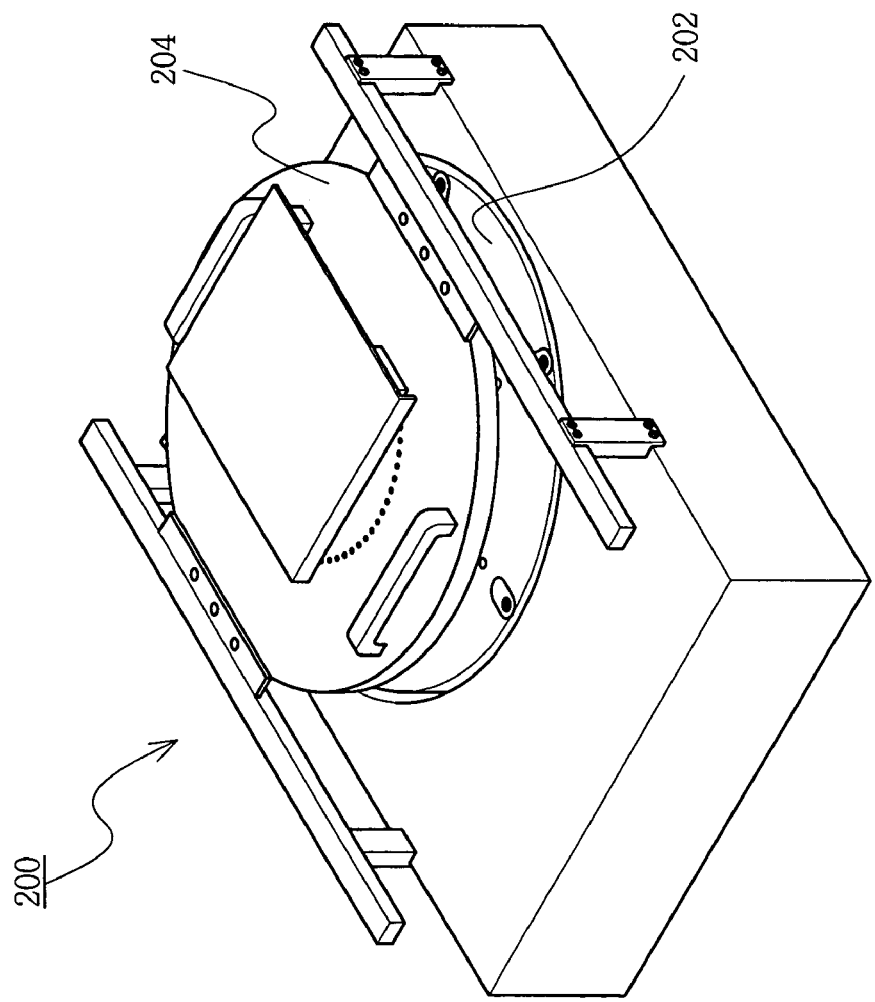
FIG. 2 is a perspective view of the baking unit according to the present invention.
Figure 3:
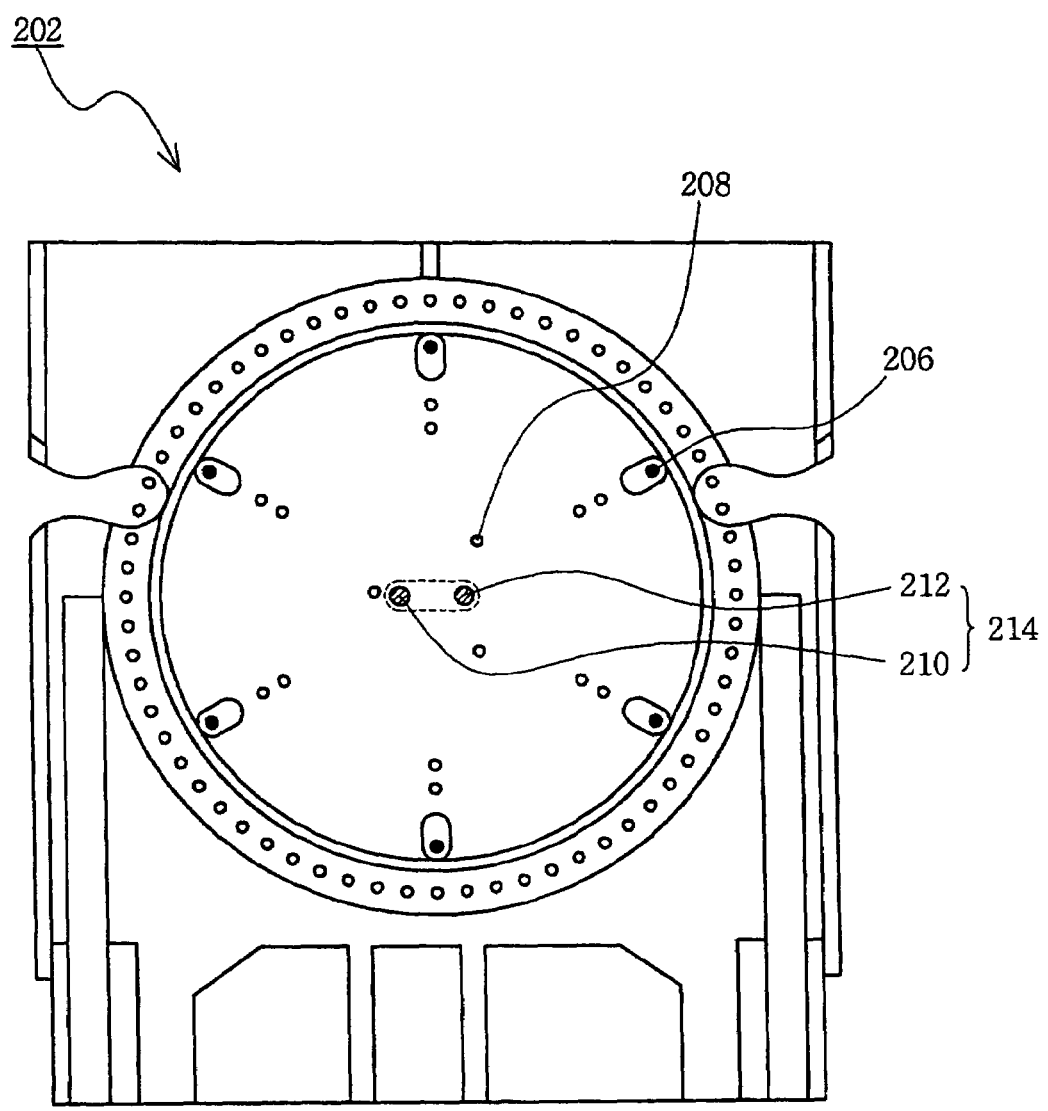
FIG. 3 is a plan view of the hot plate of the baking unit shown in FIG. 2.
Figure 4:
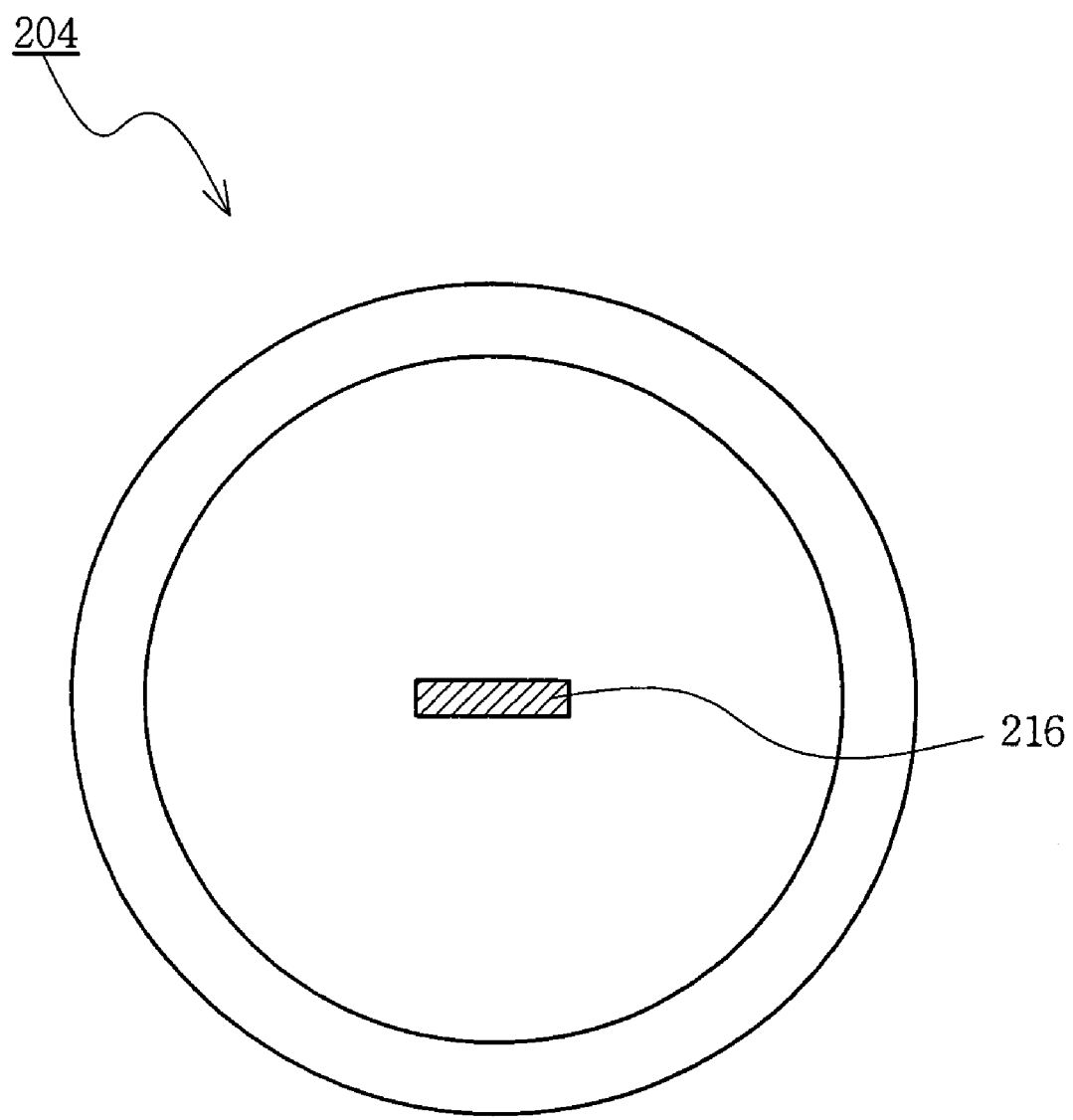
FIG. 4 is a bottom view of the cover of the baking unit shown in FIG. 2.

That is, the photoresist is not completely dried on the wafer at the completion of the coating process. Accordingly, the soft bake process is carried out on the wafer after the exposure process to cause solvent remaining in the photoresist to evaporate and thereby further dry out the layer of photoresist on the wafer. If the layer of photoresist were not dried in this way, the photosensitive material would not react to the proper degree with the light used in the exposure process. Thus, a fine pattern could not be formed on the wafer using the exposed layer of photoresist. Still, though, a small amount of the solvent remains in the photoresist throughout the developing process. This solvent is eliminated by the hard bake (H/B) process. The resulting photoresist pattern is used as a mask in etching material located under the photoresist pattern to thereby form a fine pattern. As was described in detail in the Background section, vibrations generated by the transfer robot are transmitted to the units of the inline system including the baking units. In particular, the hot plate on which the wafer is loaded and the cover under which the hot plate is disposed can be unsettled by the vibrations. If left unchecked, a dislocated baking unit would adversely affect the photolithography process. The present invention, as illustrated in FIGS. 2-4, provides a baking unit 200 which is free of such potential problems. With reference to FIG. 2, the baking unit 200 includes a hot plate 202 configured to support a wafer, and a cover 204 disposed over the hot plate 202 for providing an environment in which the wafer is heated. More specifically, the cover 204 is a discrete part of a chamber that defines a sealed space in which the wafer is heated. The hot plate 202 has a built-in heater to heat the hot plate 202 to a given temperature. As shown in FIGS. 3 and 4, the baking unit 200 also has a lifting device 208, a wafer guide 206, and a sensing device (described in more detail below) for sensing whether the hot plate 202 and/or cover 204 are level.

Referring to FIG. 3, the lifting device 208 has a plurality of lift pins that extend through a central region of the hot plate 202. The lift pins of the lifting device 208 can be raised and lowered above and below the upper surface of the hot plate 202 to support a wafer transferred to the bake unit 200 by a transfer robot, load the wafer onto the hot plate 202, and transfer a baked wafer from the hot plate 202 back to the transfer robot. The guide 206 has a plurality of guide members that are fixed on the hot plate 202 radially outwardly of the lift pins of the lifting device 208 to guide a wafer onto the upper surface of the hot plate 202 as the wafer is lowered onto the hot plate 202 by the lifting device 208.

The sensing device has a sensor unit 214 mounted to the hot plate 202. The sensor unit 214 includes a photo emitter 210, and a photo detector 212 that is spaced from the photo emitter 210. For example, the photo emitter 210 is a light source that emits ultraviolet (UV) rays, and the photo detector 212 is a UV detector. Preferably, the sensor unit 214 is disposed at the center of the upper surface of the hot plate 202 radially inwardly of the lift pins of the lifting device 208, as shown in FIG. 3. However, the sensor unit 214 may be disposed at an outer peripheral portion of the upper surface of the hot plate 202. Furthermore, although the sensor unit 214 shown in FIG. 3 consists of one photo emitter 210 and one corresponding photo detector 212, the sensor unit 214 may have more than one pair of such elements mounted to the hot plate 202.

Referring to FIG. 4, an optical element 216 is disposed at the central region of the bottom surface of the cover 204 which faces the hot plate 202. The optical element 216 can reflect/refract light emitted by the photo emitter 210 of the sensor unit 214. For example, the optical element 216 is a prism and more particularly, a triangular prism. The optical element 216 may also simply be a mirror attached to the bottom of the cover 204.

The operation of the baking unit 200 having the sensing device will now be described with reference to FIGS. 5 to 12.

Figure 5:
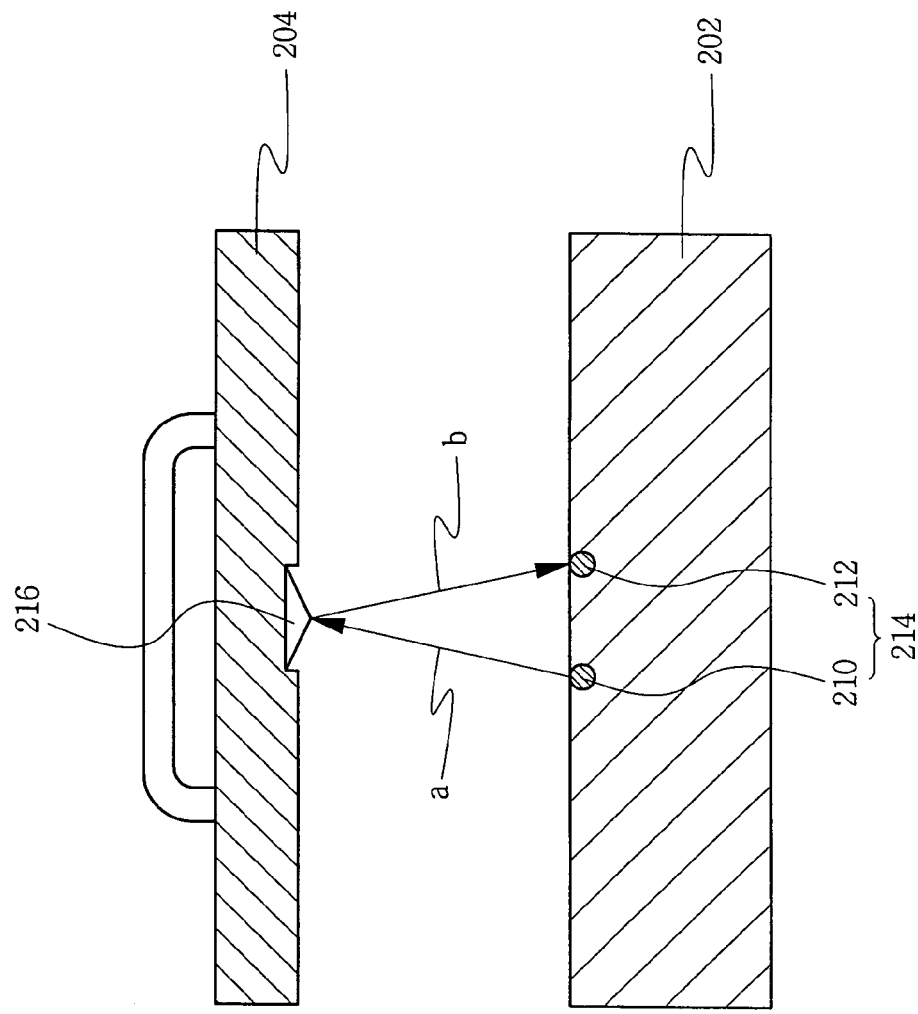
FIG. 5 is an explanatory diagram illustrating a normal state of the baking unit.
Figure 6:
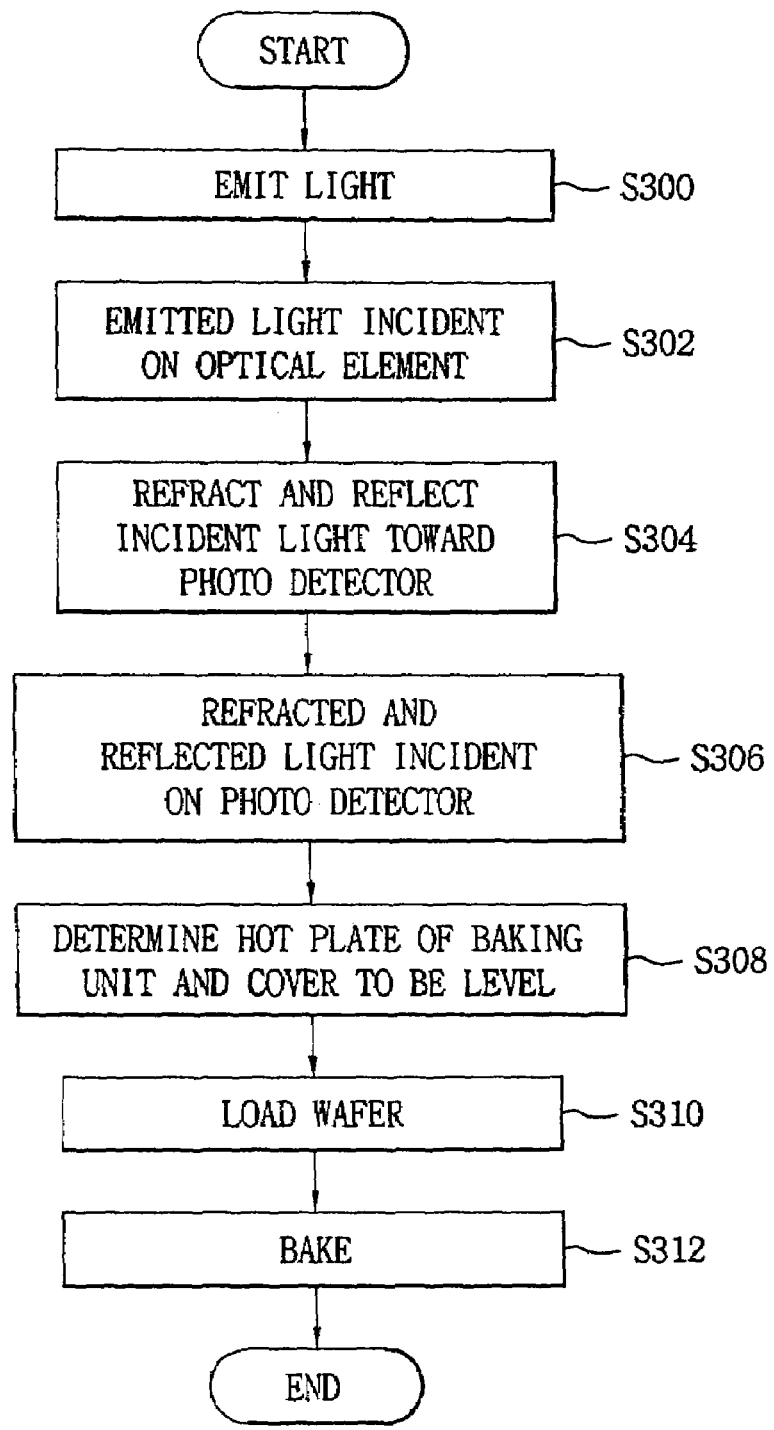
FIG. 6 is a flowchart of the operation of the baking unit when the baking unit is in the normal state shown in FIG. 5.

FIGS. 5 and 6 illustrate the case in which the hot plate 202 and the cover 204 are level. First, light is emitted from the photo emitter 210 before a wafer is transferred into the baking unit 200 (S300). The light (a) emitted from the photo emitter 210 is incident on the reflector 216 (S302). The optical element 216 refracts and reflects the light (a) (S304), and the photo detector 212 receives the light (b) refracted and reflected from the reflecting unit 216 (S306). Thus, it is determined that the hot plate 202 and the cover 204 of the baking unit 200 are in a normal (horizontal) orientation, i.e., are level (S308). That is, the baking unit 200 is deemed to be in a normal state when a maximum predetermined quantity of the light (a) emitted from the photo emitter 210 is received by the photo detector 212. Then the wafer is loaded on the hot plate 202 (S310), and (photoresist on) the wafer is baked (S312).

Figure 7:
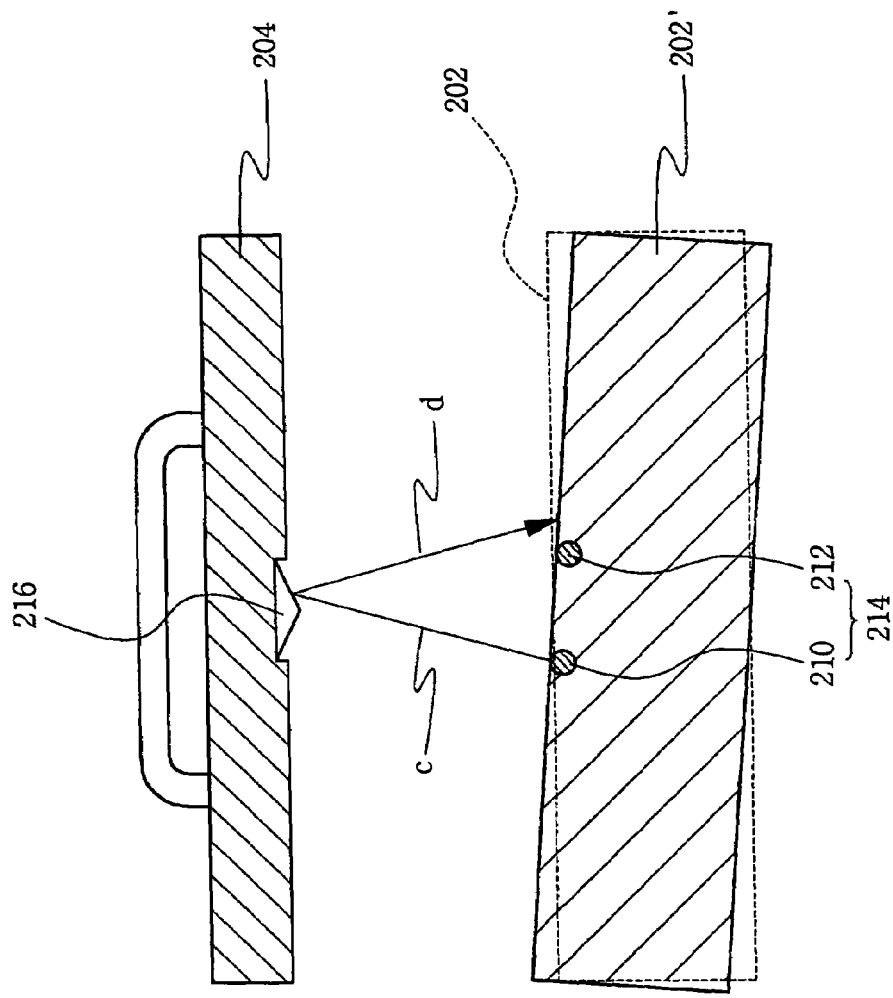
FIG. 7 is an explanatory diagram illustrating the hot plate of the baking unit in a dislocated state.
Figure 8:
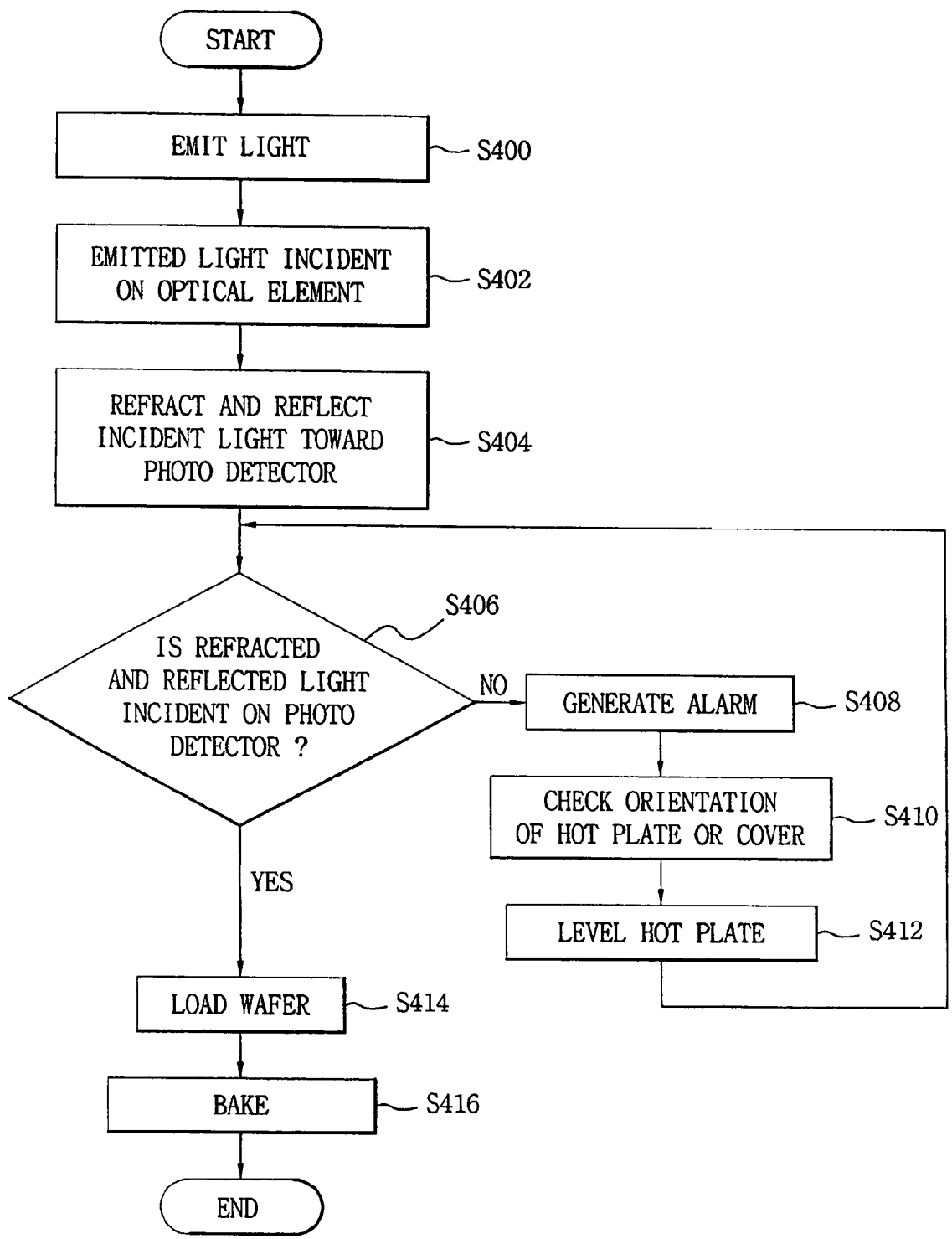
FIG. 8 is a flowchart of the operation of the baking unit when the hot plate is in the dislocated state shown in FIG. 7.

FIG. 7 illustrates the case in which the hot plate 202 has become dislocated by, for example, vibrations generated by the transfer robot used transfer wafers into and out of the baking unit 200. That is, FIG. 7 illustrates the case of a hot plate 202' in an unbalanced state. FIG. 8 illustrates a method under which the baking unit 200 operates when the hot plate 202 has become dislocated as shown in FIG. 7.

Referring to FIGS. 7 and 8, light (c) is emitted from the photo emitter 210 before a wafer is set on the hot plate 202'. The light (c) is incident on the optical element 216 (S402). The incident light (c) is refracted and reflected by the optical element 212 as light (d) and transmits the light (d) towards the hot plate 202' (S404). At this time, the photo detector 212 is monitored to determine (S406) whether the light (d) is received by the photo detector 212. That is, the amount of light received by the photo detector 212 is determined. If, as in the case shown in FIG. 7, the photo detector 212 does not receive (a predetermined quantity of) the light (d), the baking unit 200 is deemed to be in an abnormal state and an alarm is generated (S408). The alarm signals an engineer to checks the orientation of the hot plate 202' or cover 204 of the baking unit 200 (S410). Such a check reveals the dislocation of the hot plate 202'. Thus, the engineer adjusts the hot plate 202' (S412) and when the hot plate 202' becomes level as shown by reference numeral 202 in FIG. 7, the alarm stops and the engineer knows to stop adjusting the hot plate. Then, the wafer is set on the hot plate 202' (S414). Subsequently, (photoresist on) the wafer is baked (S416).

Figure 9:
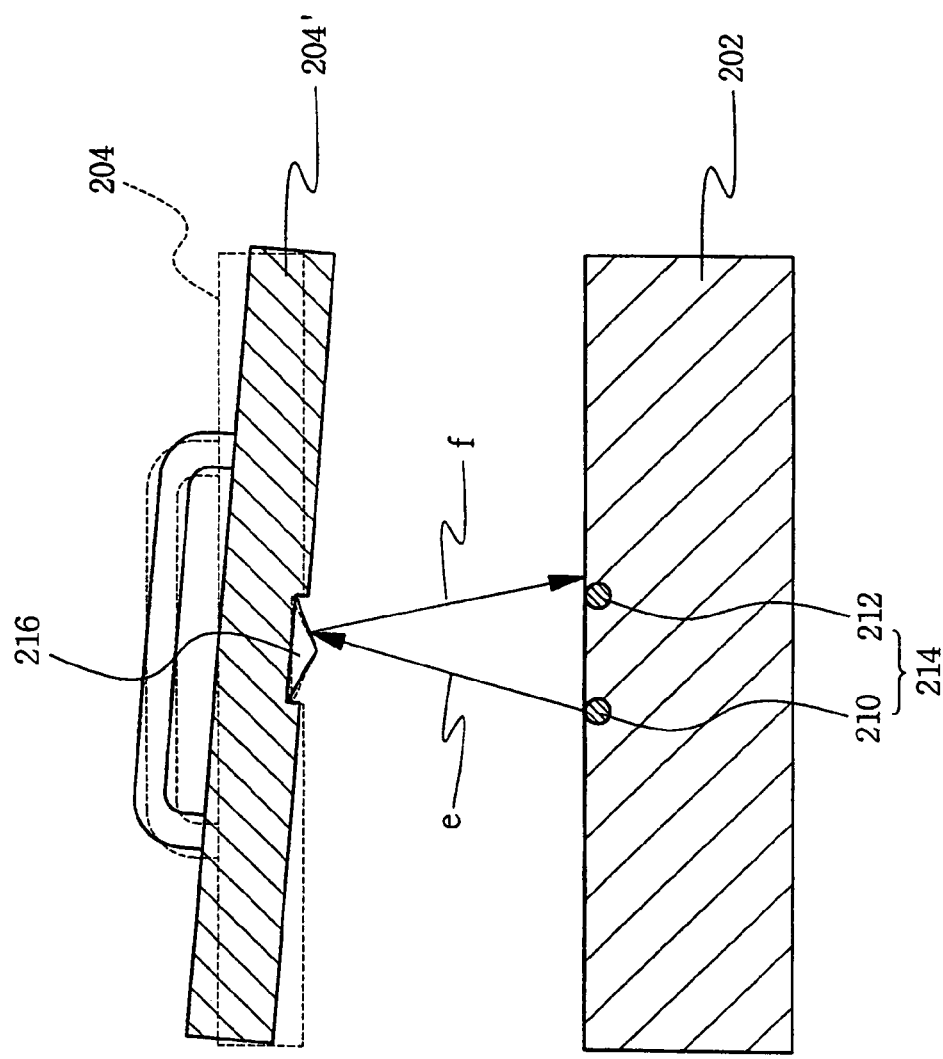
FIG. 9 is an explanatory diagram illustrating the cover of the baking unit in a dislocated state.
Figure 10:
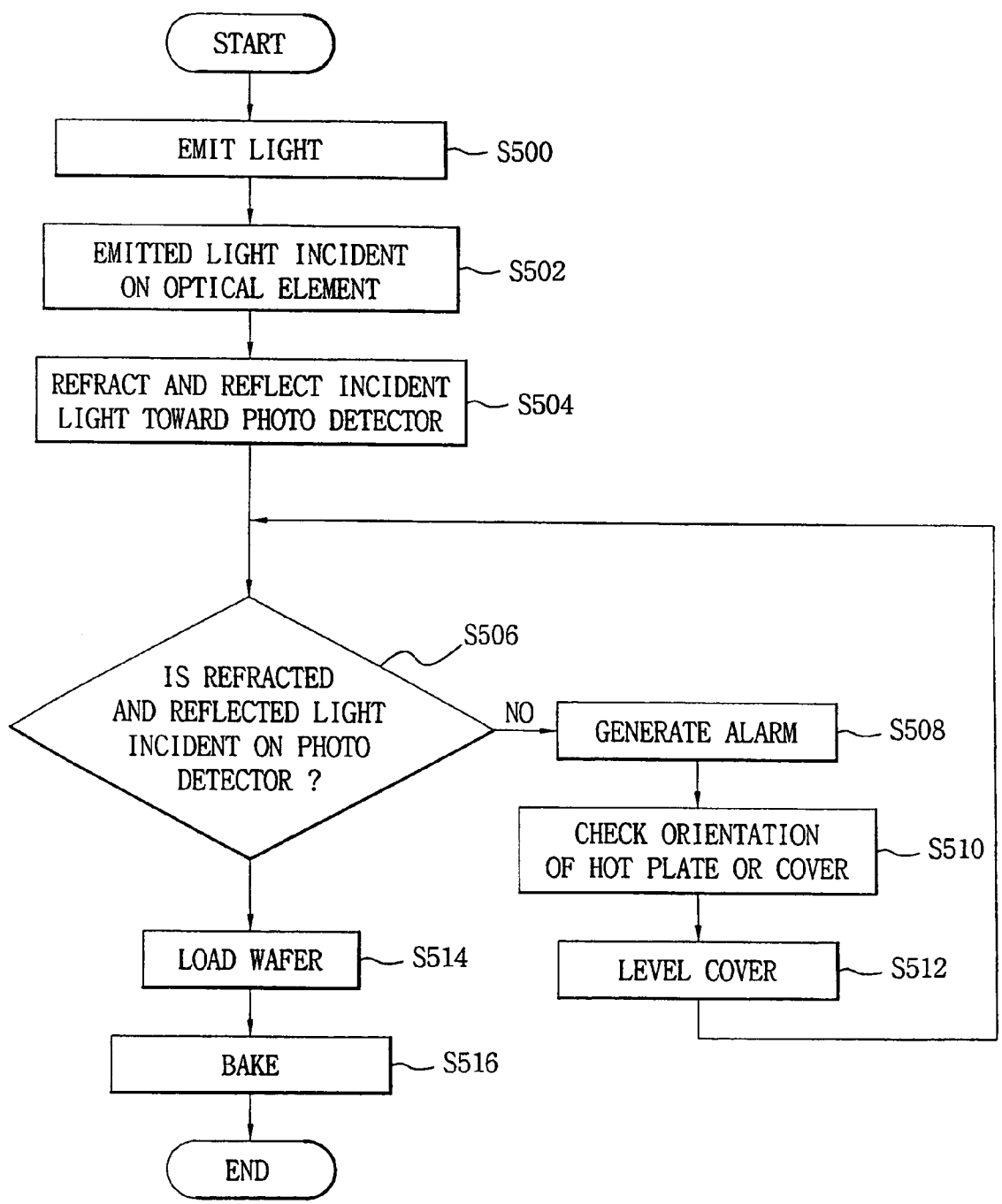
FIG. 10 is a flowchart of the operation of the baking unit when the cover is in the dislocated state shown in FIG. 9.

FIG. 9 illustrates the case in which the cover 204 has become dislocated by, for example, vibrations generated by the transfer robot used transfer wafers into and out of the baking unit 200. That is, FIG. 9 illustrates the case of a cover 204' in an unbalanced state. FIG. 10 illustrates a method under which the baking unit 200 operates when the cover 204' has become dislocated as shown in FIG. 9. Referring to FIGS. 9 and 10, light (e) is emitted from the photo emitter 210 before a wafer is transferred into the baking unit 200 (S500). The light (e) is incident on the optical element 216 (S502). The optical element 216 refracts and reflects the incident light (e) as light (f) transmits the light (f) towards the hot plate 202 (S504). At this time, the photo detector 212 is monitored to determine (S506) whether the light (f) is received by the photo detector 212. That is, the amount of light received by the photo detector 212 is determined. If, as in the case shown in FIG. 7, the photo detector 212 does not receive (a predetermined quantity of) the light (f), the baking unit 200 is deemed to be in an abnormal state and an alarm is generated (S508). The alarm signals an engineer to check the orientation of the hot plate 202 and/or cover 204' of the baking unit 200 (S410). Such a check reveals the dislocation of the cover 204'. Thus, the engineer adjusts the cover 204' (S512) and when the cover 204' becomes level as shown by reference numeral 204 in FIG. 9, the alarm stops and the engineer knows to stop adjusting the cover. Then, the wafer is set on the hot plate 202 (S514). Subsequently, (photoresist on) the wafer is baked (S516).

Figure 11:
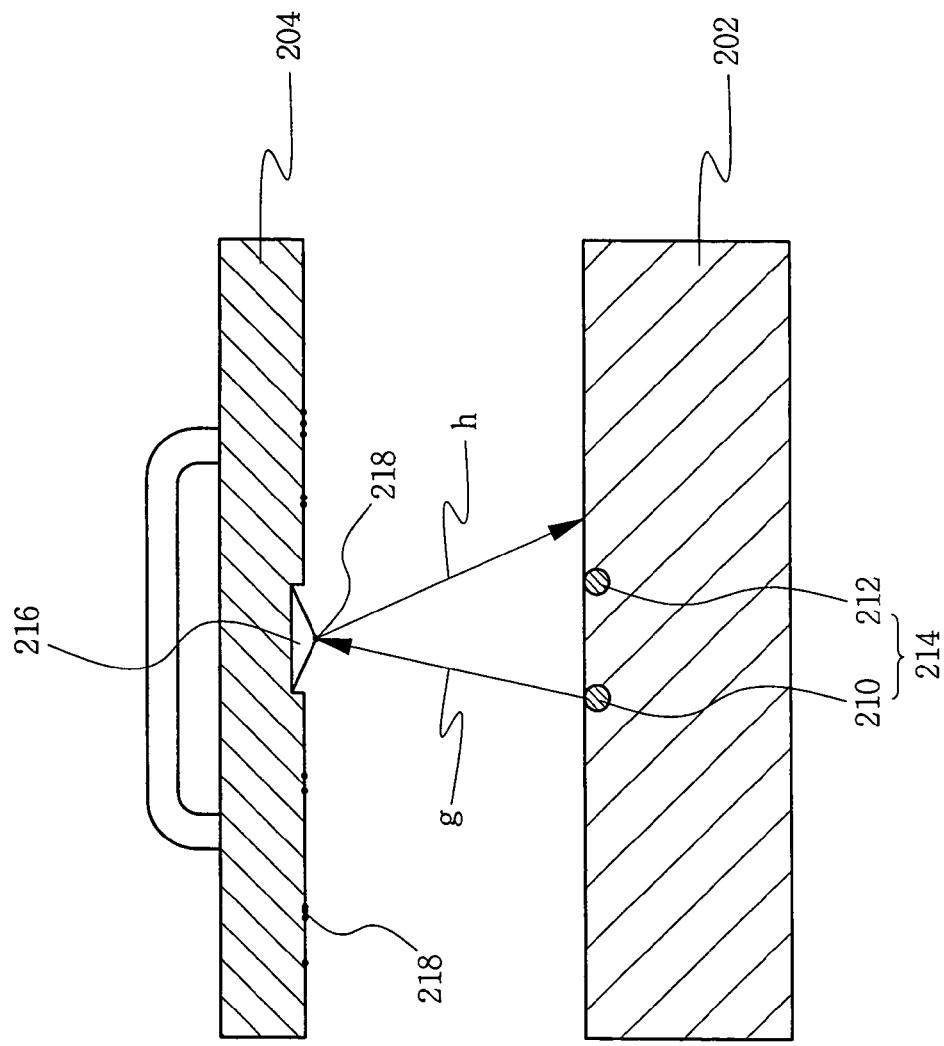
FIG. 11 is an explanatory diagram illustrating an abnormal state of the baking unit in which the cover and the hot plate are level but foreign particles are present on the cover.
Figure 12:
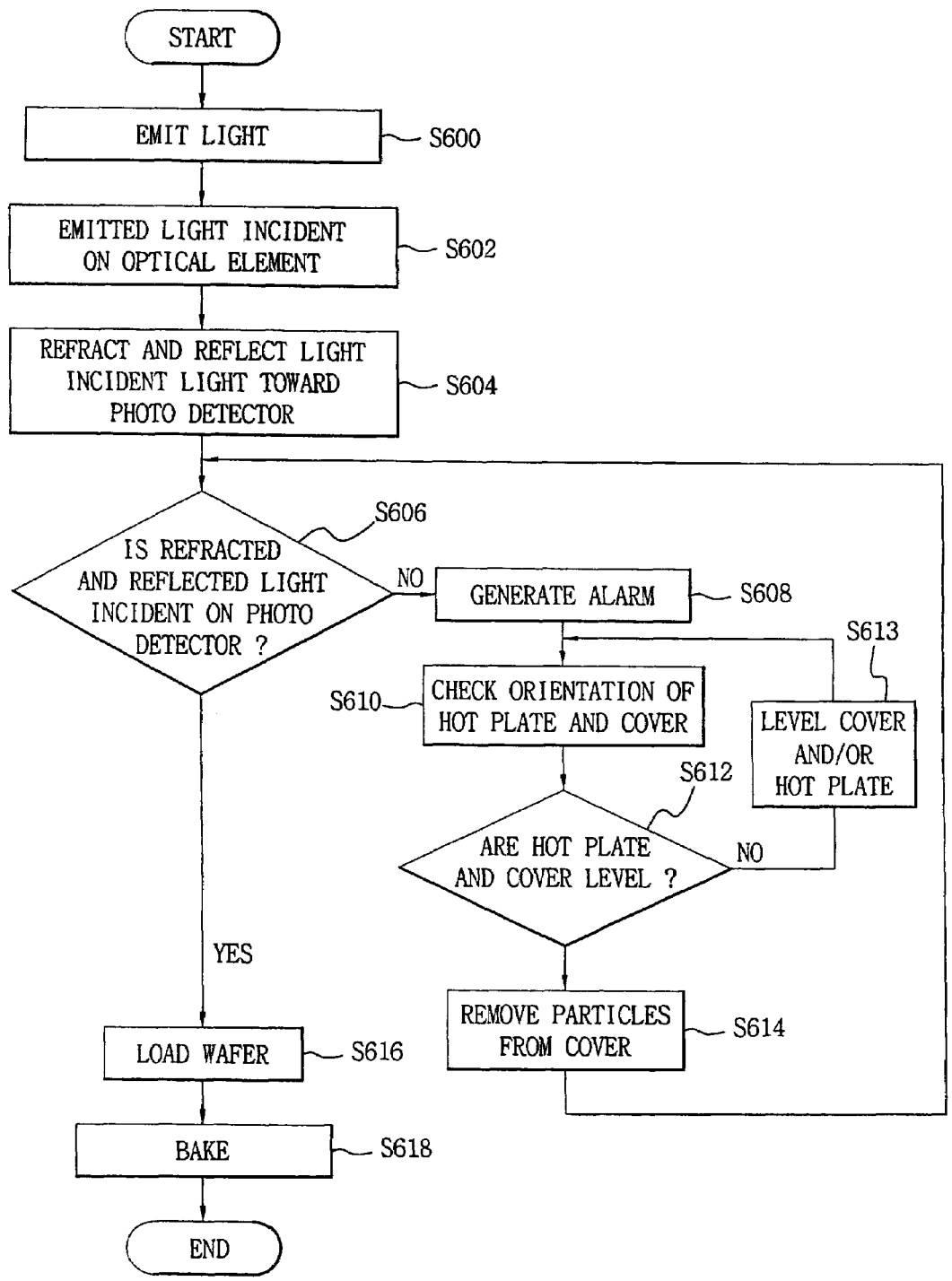
FIG. 12 is a flowchart of the overall operation of the baking unit according to the present invention.

FIG. 11 illustrates a case in which particles 218 adhere to the cover 204 of the baking unit 200. FIG. 12 illustrates a method under which the baking unit 200 operates when particles 218 adhering to the cover of the baking unit 200 as shown in FIG. 11.

Solvent contained in the photoresist naturally volatilizes during the baking process. The resulting fumes can produce particles 218 which adhere to surfaces in the baking unit 200 including the surfaces of the cover 204 as shown in FIG. 11. A wafer may be contaminated if such particles 218 were to fall off of the cover 204. Furthermore, particles in the baking unit 200 can be transferred to other units in the case of an inline system such as that of the photolithography equipment 100 shown in FIG. 1. Therefore, particles in the baking unit 200 have the potential to pollute the entire inline system.

According to the present invention, however, the sensing device can sense the presence of particles in the baking unit 200. A method under which the baking unit 200 operates when particles 218 are present within the baking unit, as shown in FIG. 11, will be described with reference to FIG. 12.

First, light (g) is emitted from the photo emitter 210 before a substrate is set on the hot plate 202 (S600). The light (g) is incident on the optical element 216 (S602). The optical element 216 refracts and reflects the incident light (g) and transmits the light as light (h) to the photo detector 212 (S604). At this time, the photo detector 212 is monitored to determine (S606) whether the light (h) is received by the photo detector 212. That is, the amount of light received by the photo detector 212 is determined. If, as in the case shown in FIG. 11, the photo detector 212 does not receive (a predetermined quantity of) the light (h), the baking unit 200 is deemed to be in an abnormal state and an alarm is generated (S608). The alarm signals an engineer to check the orientation of the hot plate 202 and cover 204 of the baking unit 200 (S610) and make the necessary correction(s) (S612-S613).

Such a check, though, reveals that neither component has been dislocated when the baking unit is in the state shown in FIG. 11. Therefore, a cleaning process is carried out to remove particles 218 from inner surfaces of the baking unit, e.g., from the underside of the cover 204 where the optical element 216 is located (S614). Subsequently, the baking unit is again monitored (S604) to determine whether (a predetermined quantity of) the light (h) is received by the photo detector 212. The wafer is set on the hot plate 202 (S616) once the (predetermined quantity of) the light (h) is received by the photo detector 212. Subsequently, (photoresist on) the wafer is baked (S618).

As described above, according to the present invention, a sensor unit constituted by a light emitter and a light detector is mounted to the hot plate of a baking unit. An optical element for refracting and reflecting the light emitted from the light emitter is mounted to the cover of the chamber of the baking unit. The sensor unit and the optical element together form a sensing device which can determine whether the hot plate and the cover are oriented properly, i.e., horizontally. Accordingly, a wafer set on the hot plate is prevented from sliding relative to the surface of the hot plate and off of the hot plate. Thus, wafers can be prevented from being broken or otherwise damaged, and a wafer set on the hot plate will be heated uniformly. Therefore, a layer of photoresist on the wafer will develop completely and the CD of the pattern formed on the wafer will have the desired characteristics.

Furthermore, the sensing device of the present invention can also be used to determine whether particles are present within the baking unit. Therefore, the contamination of wafers and of photolithography equipment having an inline system can be prevented. Thus, the semiconductor devices will have a high degree of reliability. That is, the present invention contributes to maximizing the yield of semiconductor devices.

Finally, although the present invention has been described in connection with the preferred embodiments thereof, it is to be understood that the scope of the present invention is not so limited. On the contrary, various modifications of and changes to the preferred embodiments will be apparent to those of ordinary skill in the art. Thus, changes to and modifications of the preferred embodiments may fall within the true spirit and scope of the invention as defined by the appended claims.

What is claimed is:

1. A baking unit, comprising:
   a hot plate dedicated to support a substrate;
   a cover disposed over the hot plate such that a space in which a substrate is heated is defined between the cover and the hot plate; and
   a sensing device including a sensor unit mounted to one of the hot plate and the cover, and an optical element mounted to the other of the hot plate and the cover, the sensor unit comprising a photo emitter that emits light and a photo detector that detects light of the type emitted by the photo emitter, and wherein the optical element is positioned relative to the sensor unit and the photo detector is positioned relative to the photo emitter and the optical element such that the optical element receives light emitted from the photo emitter, the optical element transmits the received light to the photo detector, and the photo detector receives a predetermined quantity of light from the optical element only when at least the hot plate and the cover are level with respect to each other.

2. The baking unit of claim 1, wherein the optical element is a prism.

3. The baking unit of claim 1, further comprising a guide disposed along an outer peripheral portion of the hot plate and configured to prevent a substrate from sliding off of the hot plate.

4. The baking unit of claim 1, further comprising a lifting device having lift pins extending through the hot plate, the lift pins being raisable and lowerable above and below an upper surface of the hot plate to support a substrate as the substrate is being loaded onto or unloaded from the hot plate.

5. Photolithography equipment comprising:
   a pre-exposure apparatus including a plurality of units in which pre-exposure processes take place, respectively, and a transfer device that transfers substrates between respective ones of the units;
   an exposure apparatus in which an exposure process takes place; and
   an interface block connecting the pre-exposure apparatus and the exposure apparatus, and wherein
   at least one of the units of the pre-exposure apparatus is a baking unit having a hot plate dedicated to support a substrate transferred thereto by the transfer device, a cover disposed over the hot plate such that a space in which a substrate is heated is defined between the cover and the hot plate, and a sensing device including a sensor unit mounted to one of the hot plate and the cover, and an optical element mounted to the other of the hot plate and the cover, the sensor unit comprising a photo emitter that emits light and a photo detector that detects light of the type emitted by the photo emitter, and wherein the optical element is positioned relative to the sensor unit and the photo detector is positioned relative to the photo emitter and the optical element such that the optical element receives light emitted from the photo emitter, the optical element transmits the received light to the photo detector, and the photo detector receives a predetermined quantity of light from the optical element only when at least the hot plate and the cover are level with respect to each other.

6. The photolithography equipment of claim 5, wherein the optical element of the sensing device is a prism.

7. The photolithography equipment of claim 5, wherein the baking unit further comprises a guide disposed along an outer peripheral portion of the hot plate and configured to prevent a substrate from sliding off of the hot plate.

8. The photolithography equipment of claim 5, wherein the baking unit further comprises a lifting device having lift pins extending through the hot plate, the lift pins being raisable and lowerable above and below an upper surface of the hot plate to support a substrate as the substrate is being loaded onto or unloaded from the hot plate.

9. The photolithography equipment of claim 5, wherein one of the units of the pre-exposure apparatus is a coating unit in which a substrate is coated with a layer of photoresist, and the baking unit is a soft bake baking unit disposed downstream of the coating unit and upstream of the exposure apparatus with respect to the direction in which substrates are transferred through the photolithography equipment.

10. The photolithography equipment of claim 5, wherein one of the units of the pre-exposure apparatus is a developing unit in which a layer of photoresist on a substrate is developed after having been exposed in the exposure apparatus, and the baking unit is a post exposure bake baking unit disposed downstream of the exposure apparatus and upstream of the developing unit with respect to the direction in which substrates are transferred through the photolithography equipment.

11. The photolithography equipment of claim 5, wherein one of the units of the pre-exposure apparatus is a developing unit in which a layer of photoresist on a substrate is developed after having been exposed in the exposure apparatus, and the baking unit is a hard bake baking unit disposed downstream of the developing unit with respect to the direction in which substrates are transferred through the photolithography equipment.

12. A method of use of a baking unit having a hot plate dedicated to support a substrate, and a cover disposed over the hot plate, the method comprising:

emitting light from first location on one of the hot plate and the cover towards the other of the hot plate and the cover;

detecting the amount of the light transmitted from said other of the hot plate and the cover to a second location on said one of the hot plate and the cover, and determining whether the amount of light detected corresponds to a first predetermined quantity of light;

checking the baking unit if the amount of light detected does not correspond to said first predetermined quantity, and servicing the baking unit when the amount of light detected does not correspond to said first predetermined quantity;

placing a substrate on the hot plate only once the amount of light detected corresponds to said first predetermined quantity; and baking the substrate after the substrate has been placed on the hot plate.

13. The method of claim 12, wherein said checking the baking unit comprises determining whether the hot plate has been dislocated, and said servicing of the baking unit comprises leveling the hot plate if the hot plate has been dislocated.

14. The method of claim 12, wherein said checking the baking unit comprises determining whether the cover has been dislocated, and said servicing of the baking unit comprises leveling the cover if said checking reveals that the cover has been dislocated.

15. The method of claim 12, wherein said servicing of the baking unit comprises cleaning the baking unit to remove particles adhering to inner surfaces of the baking unit.

16. The method of claim 12, wherein said checking the baking unit comprises determining whether the hot plate has been dislocated and determining whether the cover has been dislocated.

17. The method of claim 16, wherein said servicing comprises leveling the hot plate if the hot plate has been dislocated, and leveling the cover if the cover has been dislocated.

18. The method of claim 17, wherein said servicing comprises cleaning the baking unit to remove particles adhering to inner surfaces of the baking unit if said checking reveals that neither the hot plate nor the cover has been dislocated.

19. The method of claim 12, wherein said determining comprises determining whether the quantity of light detected corresponds to the quantity of light that is transmitted from said other of the hot plate and the cover to said second location when the baking unit is in a state which includes the cover and the hot plate being level relative to each other.

\* \* \* \* \*